United States Patent
Lee

(10) Patent No.: US 8,054,054 B2
(45) Date of Patent: Nov. 8, 2011

(54) HIGH VOLTAGE GATE DRIVER IC (HVIC) WITH INTERNAL CHARGE PUMPING VOLTAGE SOURCE

(75) Inventor: Dong Young Lee, Torrance, CA (US)

(73) Assignee: International Rectifier Corporation, El Segundo, CA (US)

(*) Notice: Subject to any disclaimer, the term of this patent is extended or adjusted under 35 U.S.C. 154(b) by 534 days.

(21) Appl. No.: 11/627,037

(22) Filed: Jan. 25, 2007

(65) Prior Publication Data

US 2007/0183174 A1    Aug. 9, 2007

Related U.S. Application Data

(60) Provisional application No. 60/763,108, filed on Jan. 27, 2006.

(51) Int. Cl.
*G05F 1/59* (2006.01)
*H02M 3/18* (2006.01)
*H02M 1/08* (2006.01)

(52) U.S. Cl. ........... 323/271; 323/282; 363/60; 363/147

(58) Field of Classification Search .................. 323/271, 323/282–290; 327/536; 363/59, 60, 97, 363/131, 147
See application file for complete search history.

(56) References Cited

U.S. PATENT DOCUMENTS

| | | | | |
|---|---|---|---|---|
| 5,132,895 A * | 7/1992 | Kase | ................ | 363/60 |
| 5,672,992 A | 9/1997 | Nadd | | |
| 6,201,717 B1 * | 3/2001 | Grant | ................ | 363/60 |
| 6,396,724 B1 * | 5/2002 | Hirst | ................ | 363/125 |
| 6,429,632 B1 * | 8/2002 | Forbes et al. | ................ | 323/282 |
| 6,559,689 B1 * | 5/2003 | Clark | ................ | 327/97 |
| 6,781,422 B1 | 8/2004 | Yang | | |
| 6,812,782 B2 * | 11/2004 | Grant | ................ | 327/589 |
| 7,271,646 B2 * | 9/2007 | Flasza | ................ | 327/538 |
| 7,388,422 B2 * | 6/2008 | Khan et al. | ................ | 327/536 |
| 7,432,756 B2 * | 10/2008 | Boe | ................ | 327/534 |
| 2003/0156439 A1 * | 8/2003 | Ohmichi et al. | ................ | 363/98 |

FOREIGN PATENT DOCUMENTS

EP    0 675 598    10/1995

* cited by examiner

*Primary Examiner* — Adolf Berhane
*Assistant Examiner* — Fred E Finch, III
(74) *Attorney, Agent, or Firm* — Farjami & Farjami LLP

(57) ABSTRACT

A circuit for using a high voltage gate driver IC (HVIC) for regulation of external floating voltage sources without use of regulation circuits. The circuit including high and low switches; at least one external voltage source coupled to the high and low switches; an HVIC having at least one internal charge pumping voltage source circuit, the HVIC being coupled to gate terminals of the high and low switches; and at least one charge pumping capacitor coupled to the at least one internal charge pumping voltage source circuit for regulating the external voltage of at least one external voltage source.

11 Claims, 4 Drawing Sheets

HIGH VOLTAGE GATE DRIVER IC (HVIC) WITH INTERNAL CHARGE PUMPING VOLTAGE SOURCE

CROSS-REFERENCE TO RELATED APPLICATION

This application is based on and claims priority to U.S. Provisional Patent Application Ser. No. 60/763,108, filed on Jan. 27, 2006 and entitled HIGH VOLTAGE GATE DRIVER IC (HVIC) WITH INTERNAL CHARGE PUMPING VOLTAGE SOURCE, the entire contents of which is hereby incorporated by reference herein.

BACKGROUND OF THE INVENTION

The present invention relates to a high voltage gate driver IC (HVIC) and more particularly to an HVIC that includes an internal charge pumping voltage source.

FIG. 1 shows a circuit 10 that includes a voltage source VCC, a conventional HVIC 12 connected to gate terminals of high and low switches 14 and 16 connected in a half bridge. The HVIC 12 receives high and low input signals HIN and LIN and drives the high and low switches 14 and 16 by issuing control signals HO and LO to the gates of the switches 14 and 16 respectively.

The switch 14 has one terminal connected to a power supply terminal (not shown); the switch 16 has one terminal connected to the ground terminal; the other terminals of the switches 14 and 16 are interconnected at a node A. When HVICs are used in special applications, for example in a Plasma Display Panel (PDP), the node A is connected to a plurality of sustain electrodes. In the example of FIG. 1, the node A is connected to the HVIC 12.

The circuit 10 further includes a simple bootstrap circuit of a series coupled diode 18 and capacitor 20 connected between the VCC and the node A. The bootstrap circuit make a voltage source for gating. As illustrated, when the low switch 16 is ON, current from the source VCC passes the diode 18, the capacitor 20, and the low switch 16. In the circuit 10, the HVIC 12 drives the switch 16, e.g., MOSFET, whose source terminal is always connected to the ground of a constant voltage source VCC.

When HVICs are used in special applications, e.g., PDP, additional voltage sources are required. FIG. 2 shows a circuit 40 for use with a special application HVIC. The circuit 40 includes a voltage source VCC, a special application HVIC 22 connected to gate terminals of high and low switches 24 and 26. The HVIC 22 receives high and low input signals HIN and LIN and drives the high and low switches 24 and 26 by issuing control signals HO and LO to the gates of the switches 24 and 26 respectively. The switch 24 has one terminal connected to a node AH and to a first external floating voltage source VHS 32. The switch 26 has one terminal connected a node AL and to a second external floating voltage source VLS 34.

The circuit 40 further includes high and low switch capacitors 28 and 30, parallel coupled with external floating voltage sources regulators 36 and 38 respectively. One terminal of the high and low switch capacitors 28 and 30 is coupled to the node AH and AL respectively.

Accommodation of the external voltage sources 36 and 38 requires additional cost and space. The external voltage sources must have a regulator circuit or feedback system 36 and 38 for output voltage regulation. This is costly in terms of circuit space and money.

What is needed is an internal charge pumping voltage sources included in an HVIC used in circuits like PDP.

SUMMARY OF THE INVENTION

It is an object of the present invention to eliminate external voltage source circuit and minimize auxiliary circuits.

It is another object of the present invention to replace external floating voltage sources in circuits using HVICs with charge pumping voltage sources internal to an HVIC.

The present invention provides a circuit for using a high voltage gate driver IC (HVIC) for regulation of external floating voltage sources without use of regulation circuits. The circuit including high and low switches; at least one external voltage source coupled to the high and low switches; an HVIC having at least one internal charge pumping voltage source circuit, the HVIC being coupled to gate terminals of the high and low switches; and at least one charge pumping capacitor coupled to the at least one internal charge pumping voltage source circuit for regulating the external voltage of at least one external voltage source.

Other features and advantages of the present invention will become apparent from the following description of the invention that refers to the accompanying drawings.

DETAILED DESCRIPTION OF EMBODIMENTS OF THE INVENTION

Figure 1:
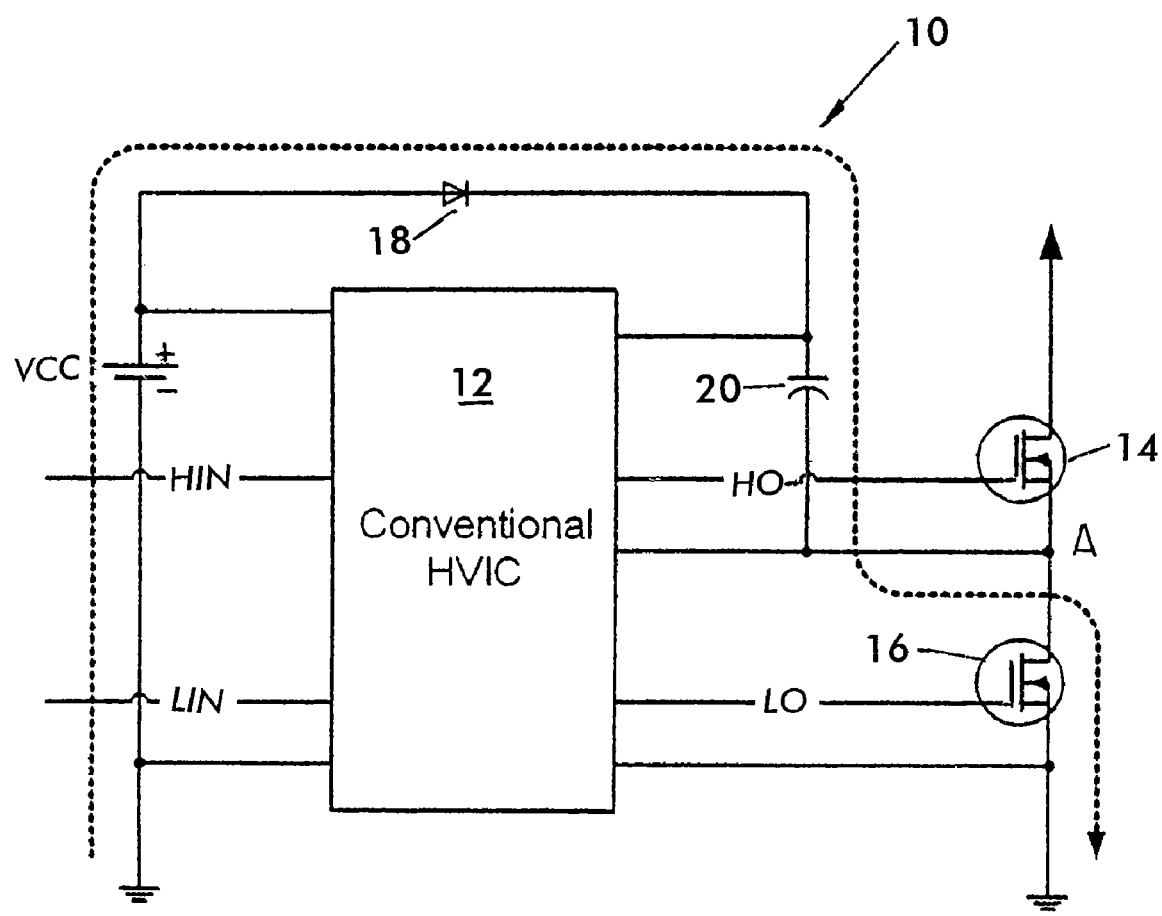
FIG. 1 is a diagram of a circuit using a conventional HVIC for driving a half bridge.
Figure 2:
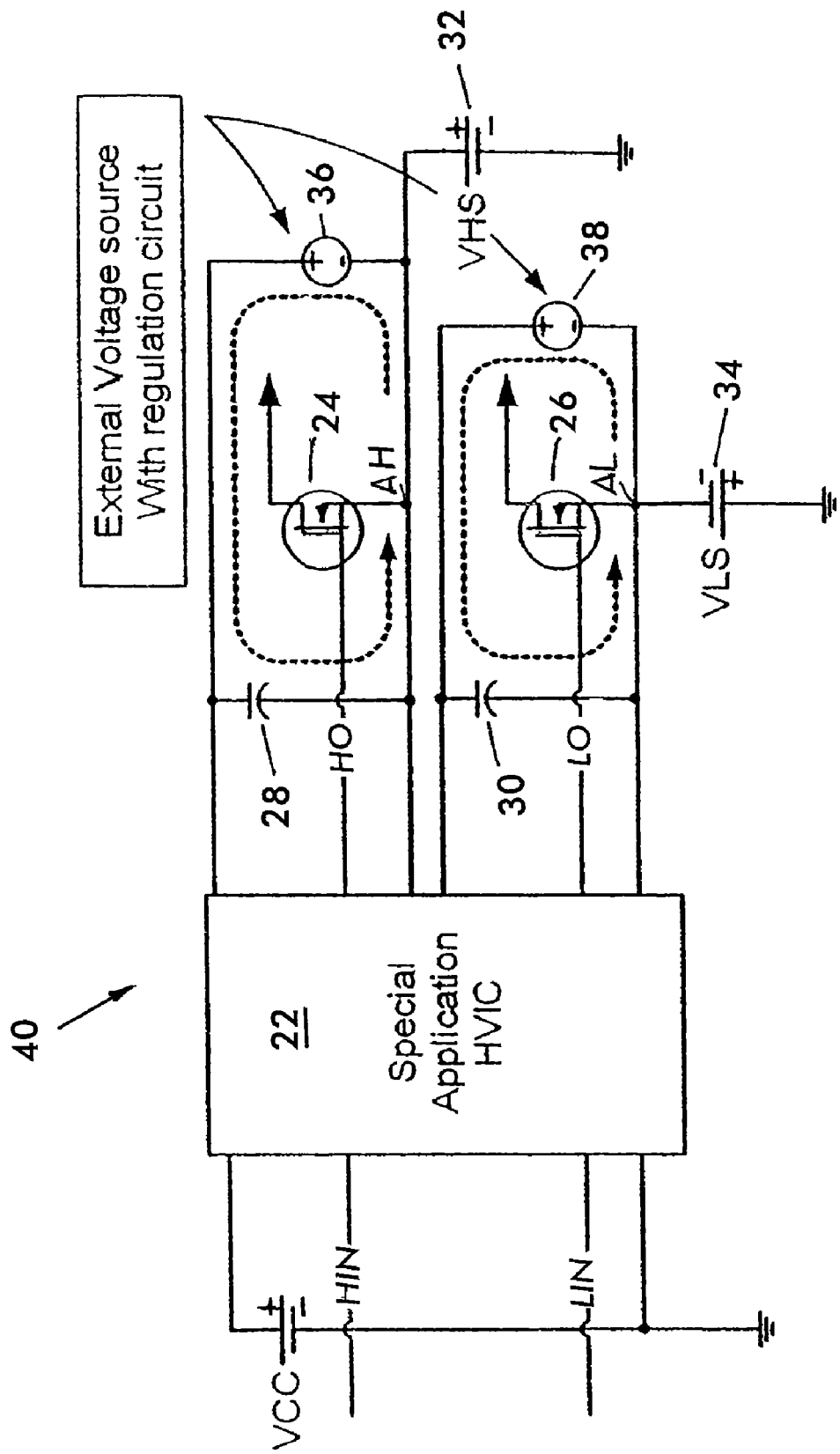
FIG. 2 is a diagram of a circuit using a conventional HVIC for special applications, for example PDP, the circuit including external voltage sources with regulation for each of the switches.
Figure 3:
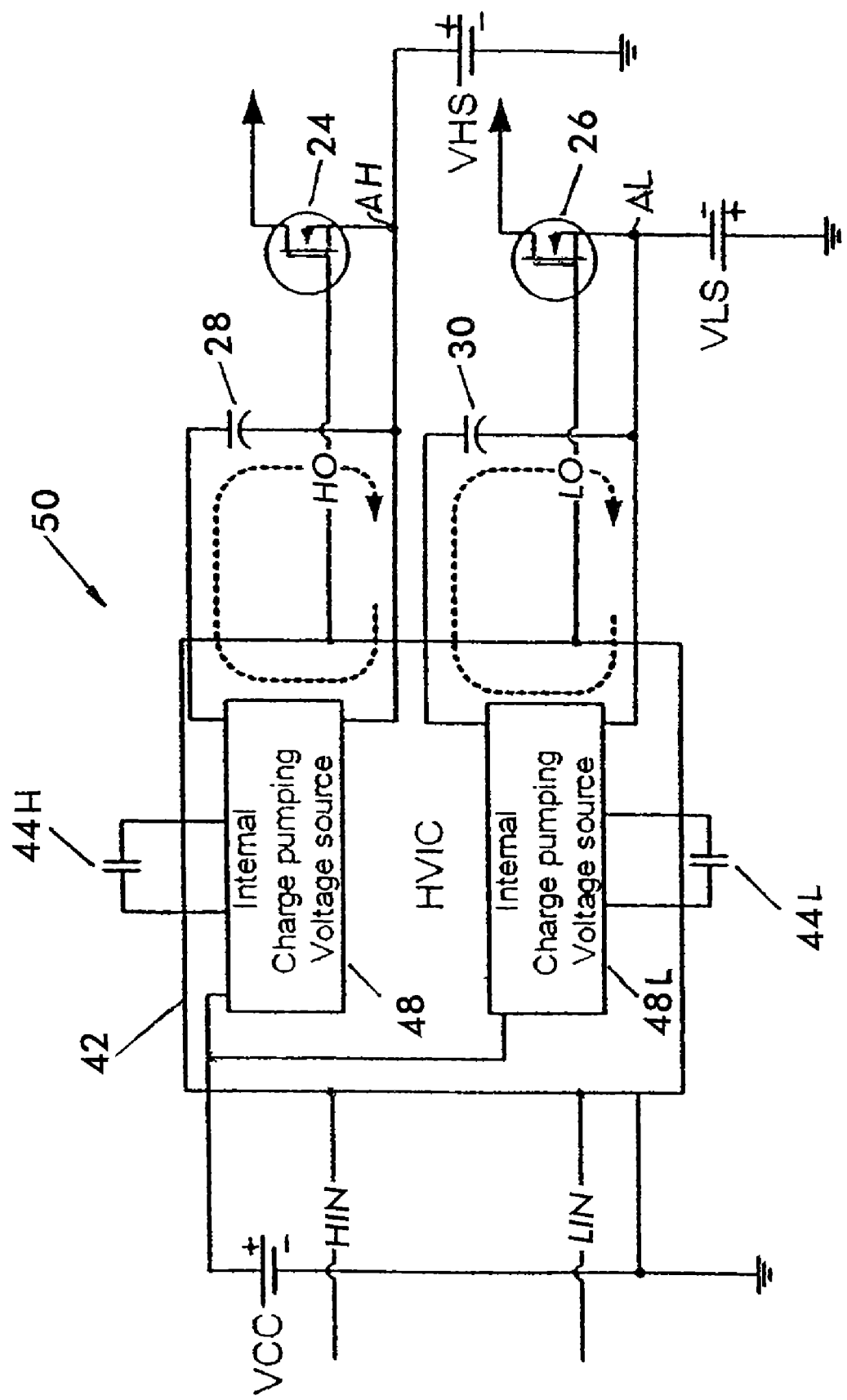
FIG. 3 is a diagram of a circuit using an HVIC having internal charge pumping voltage source in accordance with the present invention.

FIG. 3 illustrates a circuit 50 of the present invention. The uses an HVIC 42 that includes an internal charge pumping voltage source circuit 48 which requires only a single charge pumping capacitor 44H, 44L for regulation of the external floating voltage of capacitors 28 and 30. The circuit 50 includes a voltage source VCC, the HVIC 42 connected to gate terminals of high and low switches 24 and 26. The HVIC 42 receives high and low input signals HIN and LIN and drives the high and low switches 24 and 26 by issuing control signals HO and LO to the gates of the switches 24 and 26 respectively. The switch 24 has one terminal connected to a node AH and to a first external floating voltage source VHS. The switch 26 has one terminal connected a node AL and to a second external floating voltage source VLS. The circuit 50 further includes high and low switch capacitors 28 and 30. One terminal of the high and low switch capacitors 28 and 30 is coupled to the node AH and AL respectively.

Figure 4:
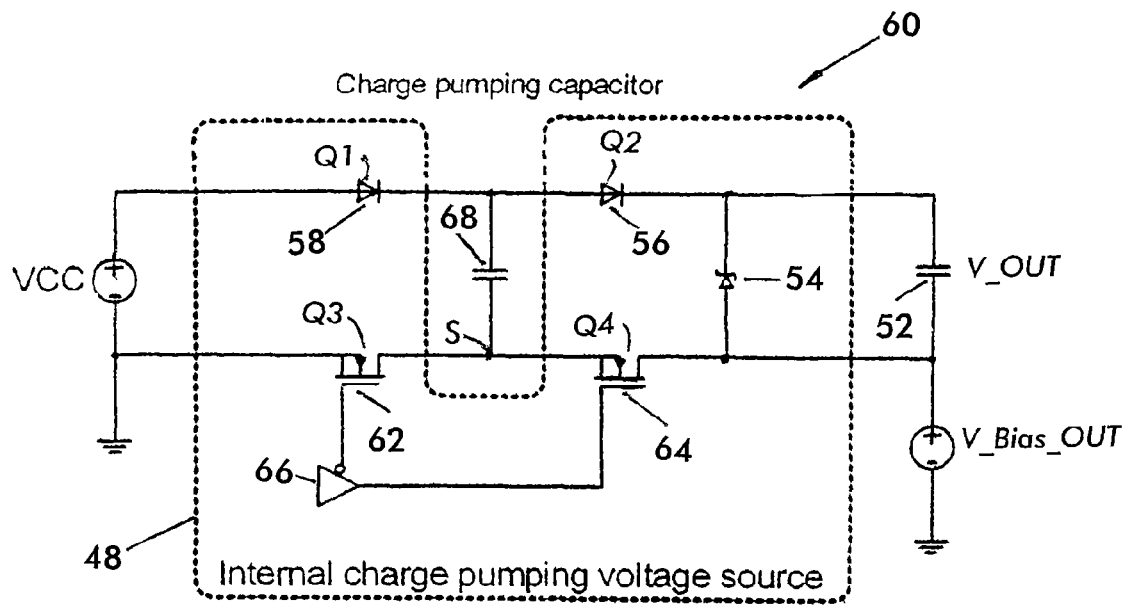
FIG. 4 is a diagram of a charge pumping circuit topology of the HVIC of FIG. 3.

FIG. 4 shows an exemplary circuit 60 of a charge pumping circuit topology. The circuit 60 includes a power source VCC providing power to an internal charge pumping voltage source circuit 48; a capacitor 52 receiving output signal from the internal charge pumping voltage source circuit 48, the capacitor 52 being connected to V-Bias-out; and a low voltage charge pumping capacitor 68 connected to the internal charge pumping voltage source circuit 48.

The internal charge pumping voltage source circuit 48 includes four high voltage switches Q1, Q2, Q3, and Q4. The switches Q3 and Q4 being connected in a bridge. An inverter 66 connected to gate terminals of the switches Q3 and Q4. First terminals of the switches Q3 and Q4 are connected to the ground and V-Bias-out. Remaining second terminals of switches Q3 and Q4 being interconnected at a node S. One terminal of the capacitor 68 being connected to the node S. The circuit 60 further comprising a Zener diode 54 parallel coupled with the capacitor 52 and an inverter 66 connected to gates of the switches Q3 and Q4.

Because the high voltage switches Q1, Q2, Q3, and Q4 require large IC space and cost, two switches Q1 and Q2, which otherwise would be connected in the same manner as the switches Q3 and Q4, can be replaced with in series connected diodes 58 and 56. This charge pumping circuit 60 can be used to regulate voltage in any situation including varying of the source terminal's voltage.

Figure 5:
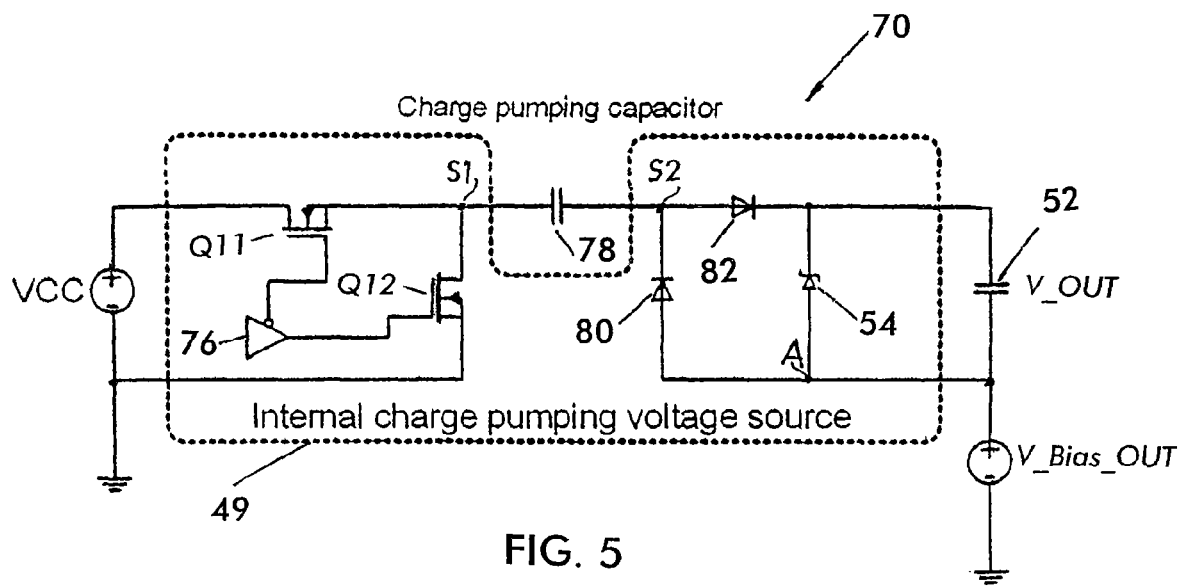
FIG. 5 is a diagram of circuit improving the charge pumping circuit topology of FIG. 4.

Additionally, because the remaining high voltage switches Q3, and Q4 still require large IC space and cost the circuit 48 can still be improved upon. FIG. 5 shows an example of one improvement on the charge pumping circuit 60. A circuit 70 includes a power source VCC providing power to an internal charge pumping voltage source circuit 49; a capacitor 52 receiving output signal from the internal charge pumping voltage source circuit 48, the capacitor 52 is connected to the V-Bias-out; and a high voltage charge pumping capacitor 78 is connected to the internal charge pumping voltage source circuit 49.

The internal charge pumping voltage source circuit 49 includes two low voltage switches Q11 and Q12 and two diodes 80 and 82. The one terminal of switch Q11 is connected to the power source VCC, one terminal of switch Q12 is connected to the ground, the other terminals of the switches Q11 and Q12 are interconnected at a node S1. A cathode of the diode 80 and an anode of the diode 82 are interconnected at a node S2. An anode of the diode 80 is connected to the node A or V-Bias-out and a cathode of the diode 82 is connected to the capacitor 52.

The capacitor 78 is connected between the nodes S1 and S2. The circuit 70 further comprising a Zener diode 54 parallel coupled with the capacitor 52 and an inverter 76 connected to gates of the switches Q11 and Q12.

The circuit 70 possesses an advantage over the circuit 60 (FIG. 4) in that only low voltage switches are uses. Low voltage switches make ICs cheap and small. Because of that, a switch driving scheme of the circuit 70 is simpler than that of the circuit 60. It is more advantageous to use the circuit 60 when voltage on a terminal of the switch 26 (FIG. 3) receives a constant source.

The present invention eliminates external voltage source regulation circuits and minimizes auxiliary circuits, space, i.e., size of the circuit, and cost. The proposed method can be applied to Level Shift Down (LSD) HVIC's low-side output driver.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A circuit for using a high voltage gate driver IC (HVIC) for regulation of external floating voltage sources, the circuit comprising:

high and low switches comprising a high switch and a low switch;
a first external voltage source coupled to the high switch and a second external voltage source coupled to the low switch;
an HVIC having at least one internal charge pumping voltage source circuit, the HVIC being coupled to a gate terminal of the high switch and a gate terminal of the low switch;
at least one charge pumping capacitor coupled to the at least one internal charge pumping voltage source circuit, the at least one charge pumping capacitor used to regulate an external floating voltage of at least one external capacitor;
a voltage source for the HVIC;
wherein the at least one external capacitor is coupled between the at least one internal charge pumping voltage source circuit and at least one of the first or second external voltage sources, wherein the HVIC receives high and low input signals and provides high and low control signals for controlling the high and low switches.

2. The circuit of claim 1, wherein the at least one internal charge pumping voltage source circuit comprises:
at least two switches, first terminals of the at least two switches being coupled at a first node;
first and second in series coupled diodes, a cathode of the first diode and an anode of the second diode being coupled at a second node,
wherein the at least one charge pumping capacitor is coupled between the first and second nodes.

3. The circuit of claim 2, wherein the at least one internal charge pumping voltage source circuit further comprises:
an inverter, coupled to gate terminals of the at least two switches; and
a Zener diode parallel coupled to the at least one external capacitor.

4. The circuit of claim 2, wherein the at least two switches are high voltage switches and second terminals of the at least two switches are coupled to a ground, an anode of the first diode being coupled to the voltage source, and a cathode of the second diode being coupled to the at least one external capacitor.

5. The circuit of claim 4, wherein the at least one internal charge pumping voltage source circuit is used to regulate varying voltage at a terminal of one of either the first external voltage source or the second external voltage source.

6. The circuit of claim 2, wherein the at least two switches are low voltage switches and a second terminal of one of the at least two switches is coupled to the voltage source, a second terminal of the other the at least two switches is coupled to a ground, an anode of the first diode being coupled to the ground and a cathode of the second diode being coupled to the at least one external capacitor.

7. The circuit of claim 6, wherein the, HVIC is a Level Shift Down HVIC and the at least one internal charge pumping voltage source circuit is a low-side output driver.

8. The circuit of claim 2, wherein the at least one charge pumping capacitor isolates DC voltage.

9. The circuit of claim 2, wherein the at least two switches are integrated in the HVIC.

10. The circuit of claim 2, wherein the first and second in series coupled diodes are integrated in the HVIC.

11. The circuit of claim 2, wherein the at least two switches and the first and second in series coupled diodes are integrated in the HVIC.

* * * * *